United States Patent
Cameron et al.

(10) Patent No.: US 10,870,921 B2
(45) Date of Patent: Dec. 22, 2020

(54) CYCLOPENTADIENYL TITANIUM ALKOXIDES WITH OZONE ACTIVATED LIGANDS FOR ALD OF TIO2

(71) Applicant: ENTEGRIS, INC., Billerica, MA (US)

(72) Inventors: Thomas M. Cameron, Newtown, CT (US); William Hunks, Danbury, CT (US)

(73) Assignee: ENTEGRIS, INC., Billerica, MA (US)

( * ) Notice: Subject to any disclaimer, the term of this patent is extended or adjusted under 35 U.S.C. 154(b) by 597 days.

(21) Appl. No.: 15/107,170

(22) PCT Filed: Dec. 20, 2014

(86) PCT No.: PCT/US2014/071754
§ 371 (c)(1),
(2) Date: Jun. 22, 2016

(87) PCT Pub. No.: WO2015/095845
PCT Pub. Date: Jun. 25, 2015

(65) Prior Publication Data
US 2016/0362790 A1    Dec. 15, 2016

Related U.S. Application Data

(60) Provisional application No. 62/060,266, filed on Oct. 6, 2014, provisional application No. 61/939,211, filed (Continued)

(51) Int. Cl.
*C23C 16/455*  (2006.01)
*C23C 16/40*   (2006.01)
(Continued)

(52) U.S. Cl.
CPC ........ *C23C 16/45553* (2013.01); *C01G 23/07* (2013.01); *C07F 7/28* (2013.01);
(Continued)

(58) Field of Classification Search
None
See application file for complete search history.

(56) References Cited

U.S. PATENT DOCUMENTS 5,130,172 A  *  7/1992  Hicks .................... C07F 1/08
                                                  427/124
5,344,948 A     9/1994  Verkade
(Continued)

FOREIGN PATENT DOCUMENTS

CN   1235976      11/1999
CN   1235976 A    11/1999
(Continued)

OTHER PUBLICATIONS

Kim, Y-J., et al., "Syndiotactic Polymerization of Amino-functionalized Styrenes Using (Pentamethylcyclopentadienyl) titanatrane/MMAO Catalyst System," Bulletin- Korean Chemical Society, vol. 25, Issue 11, pp. 1648-1652 (Nov. 25, 2004).
(Continued)

*Primary Examiner* — Joel G Horning
(74) *Attorney, Agent, or Firm* — Entegris, Inc.

(57) ABSTRACT

An organotitanium compound selected from the group consisting of:
  (i) organotitanium compounds of Formulae (I):

(Continued)

wherein:
each of $R^0$, $R^1$ and $R^2$ is the same as or different from the others, and each is independently selected from organo substituents containing olefinic or alkynyl unsaturation; and
each of $R^3$, $R^4$, $R^5$, $R^6$, and $R^7$ is the same as or different from the others, and each is independently selected from H, $C_1$-$C_{12}$ alkyl, and substituents containing olefinic or alkynyl unsaturation;
  (ii) organotitanium compounds including at least one tris(alkylaminoalkyl)amine ligand and at least one dialkylamine ligand, wherein alkyl is $C_1$-$C_6$ alkyl; and
  (iii) organotitanium compounds including a cyclopentadienyl ligand, and a cyclic dienyl or trienyl ligand other than cyclopentadienyl Such organotitanium compounds are usefully employed in vapor deposition processes for depositing titanium on substrates, e.g., in the manufacture of microelectronic devices and microelectronic device precursor structures.

1 Claim, 6 Drawing Sheets

Related U.S. Application Data on Feb. 12, 2014, provisional application No. 61/919,795, filed on Dec. 22, 2013.

(51) Int. Cl.
  *C07F 7/28* (2006.01)
  *C01G 23/07* (2006.01)
  *C07F 17/00* (2006.01)
  *H01L 21/02* (2006.01)

(52) U.S. Cl.
  CPC ............ *C07F 17/00* (2013.01); *C23C 16/405* (2013.01); *H01L 21/02186* (2013.01); *H01L 21/02208* (2013.01); *H01L 21/02271* (2013.01)

(56) References Cited

U.S. PATENT DOCUMENTS

2013/0011579 A1* 1/2013 Norman ................. C07F 17/00
  427/569
2014/0127887 A1* 5/2014 Kraus ................. H01L 21/0254
  438/478

FOREIGN PATENT DOCUMENTS

| EP | 0 468 395 A1 | 1/1992 |
| EP | 2 460 807 A1 | 6/2012 |
| JP | H04-232272 | 8/1992 |
| WO | 2009/036045 A1 | 3/2009 |

OTHER PUBLICATIONS

Xie, Meiran; Synthesis of High-Molecular-Weight Elastomeric Poly(propylene) with half-titanocene/MAO catalyst; Molecular Rapid Communication; vol. 20, pp. 167-169; 1999.

Mach, Karel; The synthesis of (115-cyclopentadienyl)titanium(IV) alkoxides by alcoholysis of the Ti-n-ligand bond in permethyl 113 :114-allyldiene-(115 -cyclopentadienyl)titanium(II); Inorganic Chemistry Communications, 2003, vol. 6, pp. 974-977.

Pinkas, Jiri; Reactions of Doubly Tucked-in Permethyltitanocene with tert-Butanol and Propargyl Alcohol, The Crystal Structures of Unusual Hydrolytic Byproducts, Collection of Czechoslovak Chemical Communications, 2008, vol. 73, pp. 967-982.

Zhibang Duan and John G. Verkade, Duan, Zhibang; 1995, vol. 34, pp. 4311-4316.

* cited by examiner

CYCLOPENTADIENYL TITANIUM ALKOXIDES WITH OZONE ACTIVATED LIGANDS FOR ALD OF TIO2

CROSS-REFERENCE TO RELATED APPLICATIONS

This application is a U.S. national phase under the provisions of 35 U.S.C. § 371 of International Patent Application No. PCT/US14/71754 filed Dec. 22, 2014, which in turn claims benefit under 35 U.S.C. § 119 of U.S. Provisional Patent Application No. 61/919,795 filed Dec. 22, 2013, the benefit of U.S. Provisional Patent Application No. 61/939,211 filed Feb. 12, 2014, and the benefit of U.S. Provisional Patent Application No. 62/060,266 filed Oct. 6, 2014. The disclosures of such international patent application and U.S. provisional patent applications are hereby incorporated herein by reference in their respective entireties for all purposes.

FIELD

The present disclosure relates to organotitanium precursors having utility for vapor deposition processes, and to vapor deposition processes utilizing same. More specifically, the disclosure relates to cyclopentadienyl titanium compounds, and to vapor deposition processes such as atomic layer deposition (ALD) in which such compounds are employed as organometallic precursors with ozone as a co-reactant, to manufacture microelectronic devices and device precursor structures, e.g., dielectric material structures, such as ferroelectric capacitors, dynamic random access memory devices, and the like.

DESCRIPTION OF THE RELATED ART

Titanium-containing thin films are widely employed in microelectronic device structures such as high dielectric capacitors, harrier films and gate structures.

Such films are formed from organometallic precursors, viz., organotitanium compounds or complexes, which are volatilized to form a corresponding precursor vapor, with the vapor then being contacted with a substrate for the product microelectronic device or device precursor structure under vapor deposition conditions. The vapor deposition processes utilized for such purpose include various types of chemical vapor deposition (CVD) as well as atomic layer deposition (ALD). ALD is preferred in many instances to achieve superior conformal coating and step coverage, as well as film uniformity.

In such vapor deposition processes, numerous organotitanium compounds and complexes have been utilized as precursors by the prior art. Desired properties of such precursors include favorable volatilization and vapor transport properties, good thermal stability and resistance to premature decomposition, advantageous film fomiation properties, and ability to deposit the titanium metal at suitably low temperatures in the vapor deposition process.

Various titanium precursors used in semiconductor manufacturing applications exhibit deficiencies such as inferior thermal stability, susceptibility to premature decomposition or inadequate decomposition in the deposition process, low vapor pressures, poor transport properties, and/or excessively high deposition temperature requirements. In consequence, the art continues to seek improved titanium precursors.

SUMMARY

The present disclosure relates to organotitanium precursors, and methods of making such precursors and of using such precursors, e.g., in the manufacture of microelectronic device products and device precursor structures.

In one aspect, the disclosure relates to an organotitanium compound selected from the group consisting of:

(i) organotitanium compounds of Formulae (I):

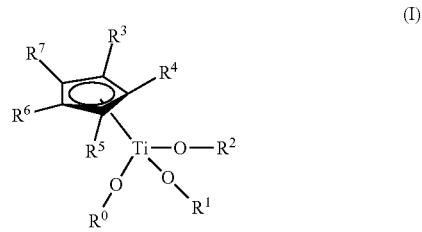

(I)

wherein:
each of $R^0$, $R^1$ and $R^2$ is the same as or different from the others, and each is independently selected from organo substituents containing olefinic or alkynyl unsaturation; and
each of $R^3$, $R^4$, $R^3$, $R^6$, and $R^7$ is the same as or different from the others, and each is independently selected from H, $C_1$-$C_{12}$ alkyl, and substituents containing olefinic or alkynyl unsaturation;

(ii) organotitanium compounds including at least one tris(alkylaminoalkyl)amine ligand and at least one dialkylamine ligand, wherein alkyl is $C_1$-$C_6$ alkyl; and (iii) organotitanium compounds including a cyclopentadienyl ligand, and a cyclic dienyl or trienyl ligand other than cyclopentadienyl.

In another aspect, the disclosure relates to an organotitanium compound selected from the group consisting of compounds of Formulae (II):

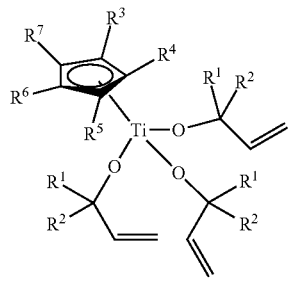

wherein:
each of $R^1$ and $R^2$ is the same as or different from the other, and each is independently selected from H and $C_1$-$C_{12}$ alkyl; and
each of $R^3$, $R^4$, $R^5$, $R^6$, and $R^7$ is the same as or different from the others, and each is independently selected from H, $C_1$-$C_{12}$ alkyl, and organo substituents containing olefinic or alkynyl unsaturation.

In another aspect, the disclosure relates to an organotitanium compound selected from the group consisting of compounds of Formulae (III):

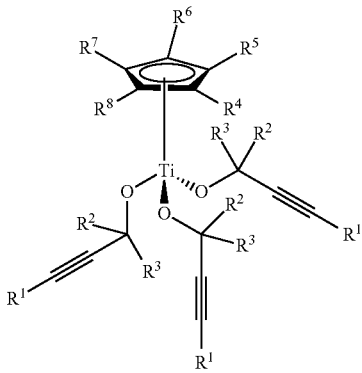

wherein:
each of $R^1$, $R^2$, $R^3$, $R^4$, $R^5$, $R^6$, $R^7$, and $R^8$ is the same as or different from the others, and each is independently selected from H and $C_1$-$C_{12}$ alkyl.

In another aspect, the disclosure relates to a precursor composition, comprising an organotitanium compound of the disclosure, and a solvent medium therefor.

A further aspect of the disclosure relates to a method of forming a titanium-containing film on a substrate, comprising conducting a vapor deposition process using an organotitanium compound as described above or alternatively an organotitanium compound of the formula

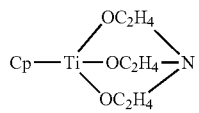

wherein Cp is

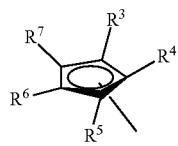

and each of $R^3$, $R^4$, $R^5$, $R^6$, and $R^7$ is the same as or different from the others, and each is independently selected from H and $C_1$-$C_{12}$ alkyl.

Another aspect of the disclosure relates to a method of making a cyclopentadienyl organotitanium compound of the disclosure, comprising reacting an alcohol, containing an organo moiety containing olefinic unsaturation, with a monocyclopentadienyl titanium triamide, to yield such compound.

A still further aspect of the disclosure relates to a precursor supply package, comprising a vessel, and an organotitanium compound of the disclosure contained in the vessel, wherein the vessel is configured for storage and dispensing of the organotitanium compound.

Other aspects, features and embodiments of the disclosure will be more fully apparent from the ensuing description and appended claims.

DETAILED DESCRIPTION

Figure 1:
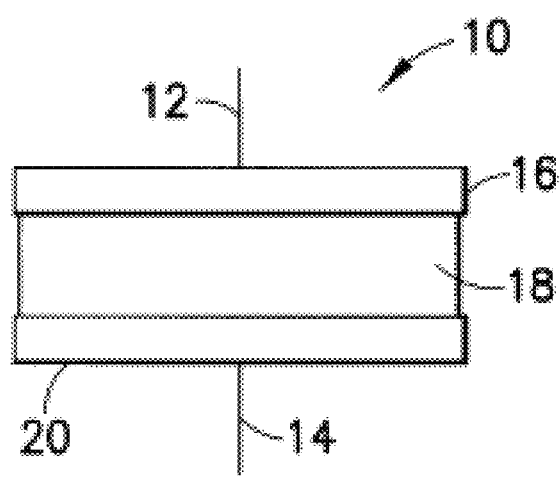
FIG. 1 is a schematic representation of a microelectronic device including a titanium dioxide-based dielectric material and top and bottom electrodes.

The present disclosure relates to organotitanium compounds useful as precursors for deposition of titanium-containing films in vapor deposition processes such as chemical vapor deposition and atomic layer deposition, and to methods of making and using such compounds.

As used herein, the term "film" refers to a layer of deposited material having a thickness below 1000 micrometers, e.g., from such value down to atomic monolayer thickness values. In various embodiments, film thicknesses of deposited material layers in the practice of the disclosure may for example be below 100, 10, or 1 micrometers, or in various thin film regimes below 200, 100, or 50 nanometers, depending on the specific application involved. As used herein, the term "thin film" means a layer of a material having a thickness below 1 micrometer.

As used herein, the singular forms "a", "and", and "the" include plural referents unless the context clearly dictates otherwise.

As used herein, the identification of a carbon number range, e.g., in $C_1$-$C_{12}$ alkyl, is intended to include each of the component carbon number moieties within such range, so that each intervening carbon number and any other stated or intervening carbon number value in that stated range, is encompassed, it being further understood that sub-ranges of carbon number within specified carbon number ranges may independently be included in smaller carbon number ranges, within the scope of the invention, and that ranges of carbon numbers specifically excluding a carbon number or numbers are included in the invention, and sub-ranges excluding either or both of carbon number limits of specified ranges are also included in the disclosure.

Accordingly, $C_1$-$C_{12}$ alkyl is intended to include methyl, ethyl, propyl, butyl, pentyl, hexyl, heptyl, octyl, nonyl, decyl, undecyl and dodecyl, including straight chain as well as branched groups of such types. It therefore is to be appreciated that identification of a carbon number range, e.g., $C_1$-$C_{12}$, as broadly applicable to a substituent moiety, enables, in specific embodiments of the disclosure, the carbon number range to be further restricted, as a sub-group of moieties having a carbon number range within the broader specification of the substituent moiety. By way of example, the carbon number range e.g., $C_1$-$C_{12}$ alkyl, may be more restrictively specified, in particular embodiments of the disclosure, to encompass sub-ranges such as $C_1$-$C_4$ alkyl, $C_2$-$C_8$ alkyl, $C_2$-$C_4$ alkyl, $C_3$-$C_5$ alkyl, or any other sub-range within the broad carbon number range. Thus, for example, the range $C_1$-$C_6$ would be inclusive of and can be further limited by specification of sub-ranges such as $C_1$-$C_3$, $C_1$-$C_4$, $C_2$-$C_6$, $C_4$-$C_6$, etc. within the scope of the broader range.

The precursors of the disclosure may be further specified in specific embodiments by provisos or limitations excluding specific substituents, groups, moieties or structures, in relation to various specifications and exemplifications thereof set forth herein. Thus, the disclosure contemplates restrictively defined compositions, e.g., a composition wherein R is $C_1$-$C_{12}$ alkyl, with the proviso that $R \neq C_i$ alkyl when M or X is a specified molecular component, and i is a specific carbon number.

The disclosure, as variously set out herein in respect of various described features, aspects and embodiments, may in particular implementations be constituted as comprising, consisting, or consisting essentially of, some or all of such features, aspects and embodiments, as well as elements and components thereof being aggregated to constitute various further implementations of the disclosure. The disclosure contemplates such features, aspects and embodiments in various permutations and combinations, as being within the scope of the disclosure. The disclosure may therefore be specified as comprising, consisting or consisting essentially of, any of such combinations and permutations of these specific features, aspects and embodiments, or a selected one or ones thereof.

The organotitanium compounds of the present disclosure include compounds selected from the group consisting of:
(i) organotitanium compounds of Formulae (I):

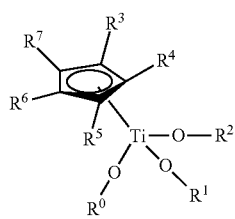

(I)

wherein:
each of $R^0$, $R^1$ and $R^2$ is the same as or different from the others, and each is independently selected from organo substituents containing olefinic or alkynyl unsaturation; and each of $R^3$, $R^4$, $R^5$, $R^6$, and $R^7$ is the same as or different from the others, and each is independently selected from H, $C_1$-$C_{12}$ alkyl, and substituents containing olefinic or alkynyl unsaturation;
(ii) organotitanium compounds including at least one tris(alkylaminoalkyl)amine ligand and at least one dialkylamine ligand, wherein alkyl is $C_1$-$C_6$ alkyl; and
(iii) organotitanium compounds including a cyclopentadienyl ligand, and a cyclic dienyl or trienyl ligand other than cyclopentadienyl.

In one embodiment of the Formula (I) compound, each of $R^0$, $R^1$, and $R^2$ contains olefinic unsaturation. In another embodiment, each of $R^0$, $R^1$, and $R^2$ is independently selected from $C_2$-$C_{12}$ alkenyl. In a still further embodiment, each of $R^0$, $R^1$, and $R^2$ is independently selected from vinyl, allyl, alkenyloxy, ethynyl, propynyl, butynyl, pentynyl, etc.

In one embodiment, each of $R^3$, $R^4$, $R^5$, $R^6$, and $R^7$ is independently selected from H, $C_1$-$C_{12}$ alkyl, and $C_2$-$C_{12}$ alkenyl. In another embodiment, each of $R^3$, $R^4$, $R^5$, $R^6$, and $R^7$ is independently selected from H and $C_1$-$C_{12}$ alkyl. In a further embodiment, each of $R^3$, $R^4$, $R^5$, $R^6$, and $R^7$ is independently selected from H and methyl.

In other embodiments, the organotitanium compounds comprise organotitanium compounds including at least one tris(alkylaminoalkyl)amine ligand and at least one dialkylamine ligand, wherein alkyl is $C_1$-$C_6$ alkyl. In a specific embodiment, the organotitanium precursor comprises dimethylamino titianium tris(2-methylaminoethyl)amide,

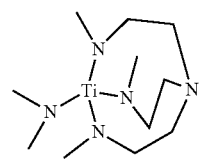

In still other embodiments, the organotitanium compounds comprises organotitanium compounds including a cyclopentadienyl ligand, and a cyclic dienyl or trienyl ligand other than cyclopentadienyl. The latter, non-cyclopentadienyl ligand may for example comprise a cycloheptatrienyl ligand, e.g., with the organotitanium compound comprising cyclopentadienyl(cycloheptatrienyl)titanium

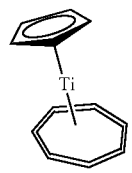

The cyclopentadienyl ligand, and the cyclic dienyl or trienyl ligand may be substituted on ring carbons thereof with hydrocarbyl ligands, e.g., with $C_1$-$C_6$ alkyl substituents.

The organotitanium compounds of the present disclosure, in a further aspect, are selected from the group consisting of compounds of Formula (II):

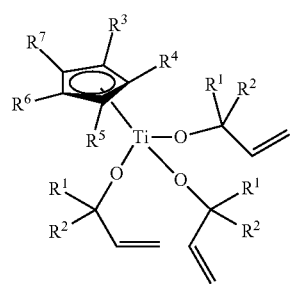

(II)

wherein:
each of $R^1$ and $R^2$ is the same as or different from the other, and each is independently selected from H and $C_1$-$C_1$, alkyl; and each of $R^3$, $R^4$, $R^5$, $R^6$, and $R^7$ is the same as or different from the others, and each is independently selected from H, $C_1$-$C_{12}$ alkyl, and organo substituents containing olefinic or alkynyl unsaturation.

In one embodiment, each of $R^3$, $R^4$, $R^5$, $R^6$, and $R^7$ in the Formula (II) compound can be the same as or different from the other, and each is independently selected from H, $C_1$-$C_{12}$ alkyl, and $C_2$-$C_{12}$ alkenyl. In another embodiment, each of $R^3$, $R^4$, $R^5$, $R^6$, and $R^7$ in the Formula (II) compound can be the same as or different from the other, and each is independently selected from H and $C_1$-$C_{12}$ alkyl. In a further embodiment, each of $R^3$, $R^4$, $R^5$, $R^6$, and $R^7$ in the Formula (II) compound can be the same as or different from the other, and each is independently selected from H and methyl.

In another embodiment, each of $R^1$ and $R^2$ in the Formula (II) compound is H. In a further embodiment, each of $R^1$ and $R^2$ in the Formula (II) compound is selected from $C_1$-$C_{12}$ alkyl. In a still further embodiment, each of $R^1$ and $R^2$ in the Formula (II) compound is methyl.

The organotitanium compounds of the present disclosure, in another aspect, are selected from the group consisting of compounds of Formula (III):

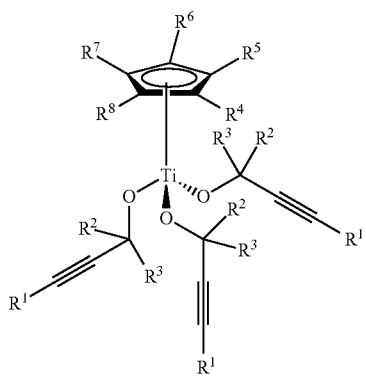

wherein:
each of $R^1$, $R^2$, $R^3$, $R^4$, $R^5$, $R^6$, $R^7$, and $R^8$ is the same as or different from the others, and each is independently selected from H and $C_1$-$C_{12}$ alkyl.

In one embodiment of the Formula (III) compounds, each of $R^4$, $R^5$, $R^6$, $R^7$, and $R^8$ is independently selected from H and methyl. In another embodiment, each of $R^1$, $R^2$, $R^3$, $R^4$, $R^5$, $R^6$, $R^7$, and $R^8$ is the same as or different from the others, and each is independently selected from H and methyl.

The disclosure in another embodiment relates to a precursor composition, comprising an organotitanium compound selected from the group consisting of compounds of the present disclosure, e.g.; of Formulae (I), (II), or (III), and a solvent medium for such compound.

The solvent medium can be of any suitable type, and can for example include at least one solvent selected from the group consisting of: $C_3$-$C_{12}$ alkanes, $C_2$-$C_{12}$ ethers, $C_6$-$C_{12}$ aromatics, $C_7$-$C_{16}$ arylalkanes, $C_{10}$-$C_{25}$ arylcyloalkanes, and further alkyl-substituted forms of aromatic, arylalkane and arylcyloalkane species, wherein the further alkyl substituents in the case of multiple alkyl substituents may be the same as or different from one another and wherein each is independently selected from $C_1$-$C_8$ alkyl, amines, ethers, aromatic solvents, glymes, tetraglymes, alkanes, alkyl-substituted benzene compounds, benzocyclohexane (tetralin), alkyl-substituted benzocyclohexane and ethers, tetrahydrofuran, xylene, 1,4-tertbutyltoluene, 1,3-diisopropylbenzene, dimethyltetralin, octane, decane, alkyl-substituted aromatic solvents, and stabilizing solvents including Lewis-base ligands.

The disclosure in another aspect relates to a method of forming a titanium-containing film on a substrate, comprising conducting a vapor deposition process using an organotitanium compound as a metal source compound for the vapor deposition process.

The organotitanium compounds that may be used as a metal source compound in such vapor deposition process include:

(i) organotitanium compounds of Formulae (I):

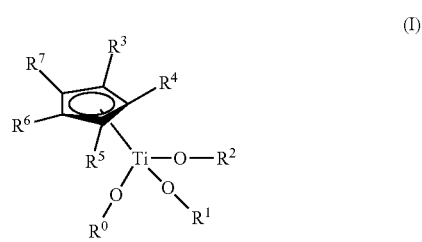

wherein:
each of $R^0$, $R^1$ and $R^2$ is the same as or different from the others, and each is independently selected from organo substituents containing olefinic or alkynyl unsaturation; and each of $R^3$, $R^4$, $R^5$, $R^6$, and $R^7$ is the same as or different from the others, and each is independently selected from H, $C_1$-$C_{12}$ alkyl, and substituents containing olefinic or alkynyl unsaturation;

(ii) organotitanium compounds including at least one tris(alkylaminoalkyl)amine ligand and at least one dialkylamine ligand, wherein alkyl is $C_1$-$C_6$ alkyl;

(iii) organotitanium compounds including a cyclopentadienyl ligand, and a cyclic dienyl or trienyl ligand other than cyclopentadienyl; and (iv) organotitanium compounds comprising cyclopentadienyl titanium compounds having triethanolamine ligands, of the formula:

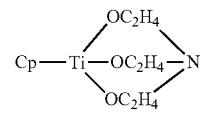

wherein Cp is

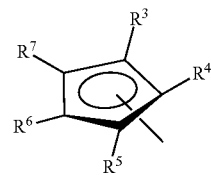

and each of $R^3$, $R^4$, $R^5$, $R^6$, and $R^7$ is the same as or different from the others, and each is independently selected from H and $C_1$-$C_{12}$ alkyl.

The aforementioned organotitanium compounds (iv) include the compound cyclopentadienyltriethanolaminetitanium wherein each of the $R^3$, $R^4$, $R^5$, $R^6$, and $R^7$ substituents of Cp is H. Such compounds also include the compound pentamethylcyclopentadienyl-triethanolaminetitanium wherein each of the $R^3$, $R^4$, $R^5$, $R^6$, and $R^7$ substituents of Cp is $CH_3$, such fully-substituted cyclopentadienyl ring being designated as Cp* in the corresponding formula

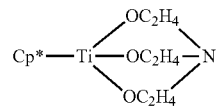

The foregoing cyclopentadienyltriethanolaminetitanium compounds can be synthesized by reaction of the corresponding cyclopentadienyltitaniumtrichloride with triethylamine and nitrilotriethanol.

The vapor deposition process in one embodiment comprises chemical vapor deposition (CVD). In another embodiment, the vapor deposition process comprises atomic layer deposition (ALD). The titanium-containing film produced by such vapor deposition process in one embodiment is part of a microelectronic device, e.g., a DRAM device.

The organotitanium precursor compounds of the disclosure have particular utility in the manufacture of microelectronic devices and microelectronic device precursor structures. For example, organotitanium precursor compounds of the disclosure can be utilized in vapor deposition processes such as CVD and ALD, to manufacture high κ dielectric material structures, such as ferroelectric capacitors, dynamic random access memory devices, and the like. The organotitanium compounds of the disclosure are particularly useful in ALD processes in the manufacture of microelectronic devices or microelectronic device precursor structures, due to the high volatility, superior thermal stability, and high surface reactivity on wafer surfaces exhibited by such precursors, particularly when ozone is used as a co-reactant in the ALD process.

A further aspect of the disclosure relates to a precursor supply package, comprising a vessel, and an organotitanium compound of the present disclosure, contained in the vessel, wherein the vessel is adapted for storage and dispensing of such organotitanium compound.

The precursors of the disclosure are readily synthesized, as discussed hereinafter.

In application to ALD and other vapor deposition processes, organotitanium compounds of the disclosure can be delivered at low temperature, e.g., in a range of from 90 to 150° C., with a liquid bubbler, and are thermally stable at such delivery temperatures, i.e., do not thermally decompose. These precursor compounds can be used in ALD as well as other vapor deposition processes, and such vapor deposition processes may for example be carried out at temperature in a range of from 200° C. to 300° C. The organotitanium precursor compounds of the disclosure, in one embodiment, can be delivered by bubbling an appropriate carrier gas through a liquid including the precursor compound, e.g., a volume of the precursor compound in the liquid phase at temperature above the melting point of such compound, or, alternatively, a solution of the precursor compound in a suitable solvent, to entrain vapor associated with the liquid by virtue of its vapor pressure, in the carrier gas.

The organotitanium compounds of the disclosure in vapor deposition applications such as CVD and ALD, may utilize appropriate oxidizers, co-reactants, process conditions, etc., within the skill of the art, based on the disclosure herein, to effect deposition of titanium-containing films. The vapor deposition process may involve direct liquid injection (DLI) or bubbler techniques, or any other suitable methods, in order to effect delivery of the precursor. Useful oxidizers in specific embodiments include, without limitation, ozone, water, oxygen, peroxides, nitrous oxide, carbon dioxide and/or alcohols. In one specific embodiment, an organotitanium compound of Formula (II) and ozone are utilized as a co-reactant species in an ALD process, to effect deposition of titanium dioxide on a substrate.

It will be recognized that multiple additives can be employed with the titanium precursor compounds of the disclosure, in specific embodiments, to constitute formulations that achieve enhanced thermal stability of the precursor and/or improved film properties, e.g., improved step coverage on high aspect ratio structures, in relation to corresponding formulations lacking such additives. Multiple additive formulations of such type can be specified with respect to the relative proportions of the precursor and additive(s) appropriate to a given implementation of the disclosure, by empirical determination involving varying the concentration(s) of a selected one or ones of the respective components of the formulation, to determine resulting stability and step coverage characteristics or other film properties for the resulting formulations.

Vapor deposition processes using the precursors of the disclosure can be carried out under any suitable process conditions (temperatures, pressures, flow rates, concentrations, ambient environment, etc.) that are appropriate to form corresponding titanium-containing films of a desired character, within the skill of the art, based on the disclosure herein.

In an ALD process embodiment, precursor vapor is introduced to a vapor deposition chamber, following which a purge gas is pulsed to the chamber to remove such precursor gas mixture. Next, a second fluid is introduced to the vapor deposition chamber to complete the reaction sequence. The second fluid may for example comprise ozone, oxygen or other oxygen-containing gas for the formation of an oxide film on the substrate, e.g., a $TiO_2$ film. Alternatively, the second fluid may comprise nitrogen, for formation of a titanium nitride film on the substrate, or the second fluid may comprise sulfur, for formation of a titanium sulfide film on the substrate.

In various embodiments, titanium precursors of the present disclosure can be used to manufacture high κ dielectric material structures, such as ferroelectric capacitors or dynamic random access memory devices (DRAMs) comprising high κ dielectric capacitors or gate dielectric material structures in logic devices.

Titanium-containing films formed from organotitanium compounds of the present disclosure can be doped, co-deposited, alloyed or layered with a secondary material, e.g., a material selected from among Nb, Ta, Zr, Hf, Ge, Si, Sn, La, Y, Ce, Pr, Nd, Gd, Dy, Sr, Ba, Ca, and Mg, and oxides of such metals. For example, various embodiments of the disclosure contemplate titanium-containing films being formed from precursors of the disclosure, in which the titanium-containing film is optionally doped with a dopant material, e.g., a Group IV dopant species.

ALD formation of conformal thin films of titanium dioxide can be carried out in various embodiments using organotitanium compounds of the present disclosure, at suitable process conditions, e.g., temperature in a range of from 200° C. to 350° C., using oxygen sources such as ozone, oxygen, water, peroxides, nitrous oxide, carbon dioxide, carbon dioxide or alcohols, at pressure in a range of from 0.2 to 20

Torr. Such oxygen-containing oxidizer species can be activated, e.g., by remote or direct plasma.

CVD processes can likewise be carried out to form titanium oxide films on substrates, using suitable oxygen sources, e.g., oxygen sources other than ozone and peroxide, and without plasma activation. CVD processes in various embodiments can be carried out at temperature in a range of from 200° C. to 600° C. and pressure in a range of from 0.2 to 10.0 Torr. Higher temperature and pressure conditions can be utilized, but generally require lower oxidizer concentrations in order to avoid gas-phase reactions.

In various applications in which organotitanium compounds of the present disclosure are utilized in ALD processes to form $TiO_2$ films, pulses of the titanium precursor and co-reactant ozone are utilized to form the titanium dioxide film. In such applications, the reactivity of the titanium precursor with ozone is a primary factor influencing the rate of film growth. Inasmuch as the organotitanium compounds of the present disclosure contain olefinic unsaturation, e.g., vinyl groups, allyl groups, alkenyloxy functionality, etc., the organotitanium compounds exhibit superior reactivity, resulting in higher film growth rates as compared to corresponding saturated organotitanium compounds, as well as yielding ALD films of superior conformality that are uniformly coated on the substrate with high step coverage and conformality even on high aspect ratio structures.

Another aspect of the disclosure relates to a method of making an organotitanium compound of the present disclosure, e.g., of Formulae (I), (II), or (III), comprising reacting an alcohol containing an organo moiety containing olefinic or alkynyl unsaturation, e.g., vinyl, allyl, alkenyloxy, ethynyl, propynyl, butynyl, etc., with a monocyclopentadienyl titanium triamide to yield the organotitanium compound, as a monocyclopentadienyl titanium trialkoxide compound of such formula.

In a specific embodiment, cyclopentadienyl titanium alkoxide precursors of Formula (II) are readily synthesized by reaction synthesis processes such as the following:

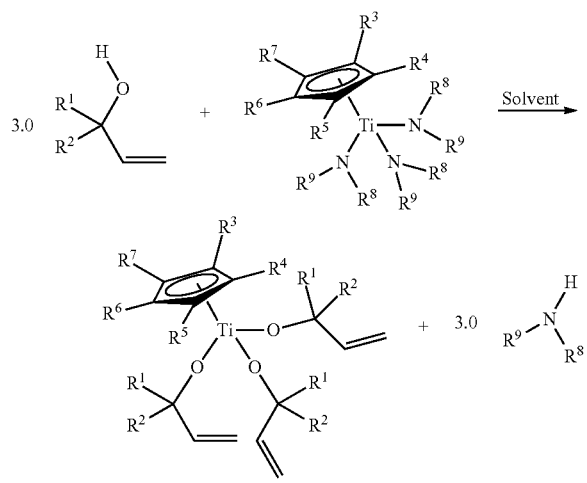

In this reaction scheme, three equivalents of an appropriate alcohol are added to a monocyclopentadienyl titanium triamide, in a solvent medium that is compatible with the reactants and reaction products. The resulting protonolysis reaction produces the desired monocyclopentadienyl titanium trialkoxide and three equivalents of amine.

Cyclopentadienyl titanium alkoxide compounds of the present disclosure can be used in vapor deposition processes such as ALD and CVD, to deposit a wide variety of titanium-containing metal films on substrates, e.g., titanium dioxide films, PZT films, PLZT films, BST films, barium titanate films, strontium titanate films, titanium nitride films, titanium sulfide films, oxide films containing titanium, etc.

Organotitanium precursor compounds of the disclosure can be supplied in any suitable form for volatilization to produce precursor vapor for deposition contacting with the substrate, e.g., in a liquid form that is vaporized or as a solid that is dissolved or suspended in a solvent medium for flash vaporization, as a sublimable solid, or as a solid having sufficient vapor pressure to render it suitable for vapor delivery to the deposition chamber, or in any other suitable form.

When solvents are employed for delivery of the precursors of the disclosure, any suitable solvent medium can be employed in which the precursor can be dissolved or dispersed for delivery. By way of example, the solvent medium may be a single-component solvent or a multicomponent solvent mixture, including solvent species such as $C_3$-$C_{12}$ alkanes, $C_2$-$C_{12}$ ethers, $C_6$-$C_{12}$ aromatics, $C_7$-$C_{16}$ arylalkanes, $C_{10}$-$C_{25}$ arylcyloalkanes, and further alkyl-substituted forms of aromatic, arylalkane and arylcyloalkane species, wherein the further alkyl substituents in the case of multiple alkyl substituents may be the same as or different from one another and wherein each is independently selected from $C_1$-$C_8$ alkyl.

Illustrative solvents include amines, ethers, aromatic solvents, glymes, tetraglymes, alkanes, alkyl-substituted benzene compounds, benzocyclohexane (tetralin), alkyl-substituted benzocyclohexane and ethers, with tetrahydrofuran, xylene, 1,4-tertbutyltoluene, 1,3-diisopropylbenzene, dimethyltetralin, octane and decane being potentially useful solvent species in specific applications.

In some embodiments, it may be desirable to utilize aromatic solvents such as xylene, 1,4-tertbutyltoluene, 1,3-diisopropylbenzene, tetralin, dimethyltetralin and other alkyl-substituted aromatic solvents. The solvent medium may also comprise a stabilizing solvent, e.g., a Lewis-base ligand.

In other embodiments, preferred solvents may include amine solvents, neutral amities such as DMAPA, octane or other aliphatic solvents, aromatic solvents such as toluene, ethers such as tetrahydrofuran (THF), and tetraglymes.

In specific applications, the cyclopentadienyl titanium alkoxide precursor compounds may be supplied in liquid delivery systems as individual precursor compounds or mixtures of precursor compounds, in solvent media that may be comprised of a single component solvent, or alternatively may be constituted by a solvent mixture, as appropriate in a given application. The solvents that may be employed for such purpose can be of any suitable type in which the specific precursor(s) can be dissolved or suspended, and subsequently volatilized to form the precursor vapor for contacting with the substrate on which the titanium metal-containing film is to be deposited.

In other specific applications, bubbler delivery of the cyclopentadienyl titanium alkoxide precursor is contemplated, in which the bubbler is arranged to operate at or above the melting point of the precursor compound.

In general, cyclopentadienyl titanium alkoxide precursor compositions of the present disclosure can alternatively comprise, consist, or consist essentially of any compound, compounds, or formulation disclosed herein, in specific embodiments of the disclosure. In specific embodiments, cyclopentadienyl titanium alkoxide precursor compounds of the present disclosure can be utilized in combinations, in which two or more of such precursor compounds are mixed with one another, e.g., in a solution as a precursor cocktail composition for liquid delivery.

In some embodiments, the cyclopentadienyl titanium alkoxide precursor species are individually dissolved in solvent(s) and delivered into vaporizers for volatilization of the precursor solution to form a precursor vapor that then is transported to the deposition chamber of the deposition system to deposit the titanium-containing film on a wafer or other microelectronic device substrate. In one embodiment, the precursor is dissolved in an ionic liquid medium, from which precursor vapor is withdrawn from the ionic liquid solution under dispensing conditions.

In other embodiments, the cyclopentadienyl titanium alkoxide precursors are delivered by solid delivery techniques, in which the solid is volatilized to form the precursor vapor that then is transported to the deposition chamber, and with the solid precursor in the first instance being supplied in a packaged form for use.

As a still further alternative, the cyclopentadienyl titanium alkoxide precursors may be stored in an adsorbed state on a suitable solid-phase physical adsorbent storage medium in the interior volume of a storage and dispensing vessel. In use, the precursor vapor is dispensed from the vessel under dispensing conditions involving desorption of the adsorbed precursor from the solid-phase physical adsorbent storage medium.

In general, supply vessels for precursor delivery may be of widely varying type, and may employ vessels such as those commercially available from ATMI, Inc. (Danbury, Conn., USA) under the trademarks SDS, SAGE, VAC, VACSorb, and ProE-Vap, as may be appropriate in a given storage and dispensing application for a particular precursor compound or composition of the present disclosure.

The precursors of the present invention enable a wide variety of microelectronic devices, e.g., semiconductor products, flat panel displays, etc., to be fabricated with titanium-containing films of superior quality.

FIG. 1 is a schematic representation of a microelectronic device structure comprising a capacitor 10, including a titanium-containing dielectric material 18 between a top electrode 16 associated with lead 12, and bottom electrode 20 associated with lead 14. The dielectric material 18 may be formed by ALD using a cyclopentadienyl titanium alkoxide precursor of the present disclosure to deposit the titanium-containing dielectric material on the bottom electrode, prior to formation of the top electrode layer.

Figure 2:
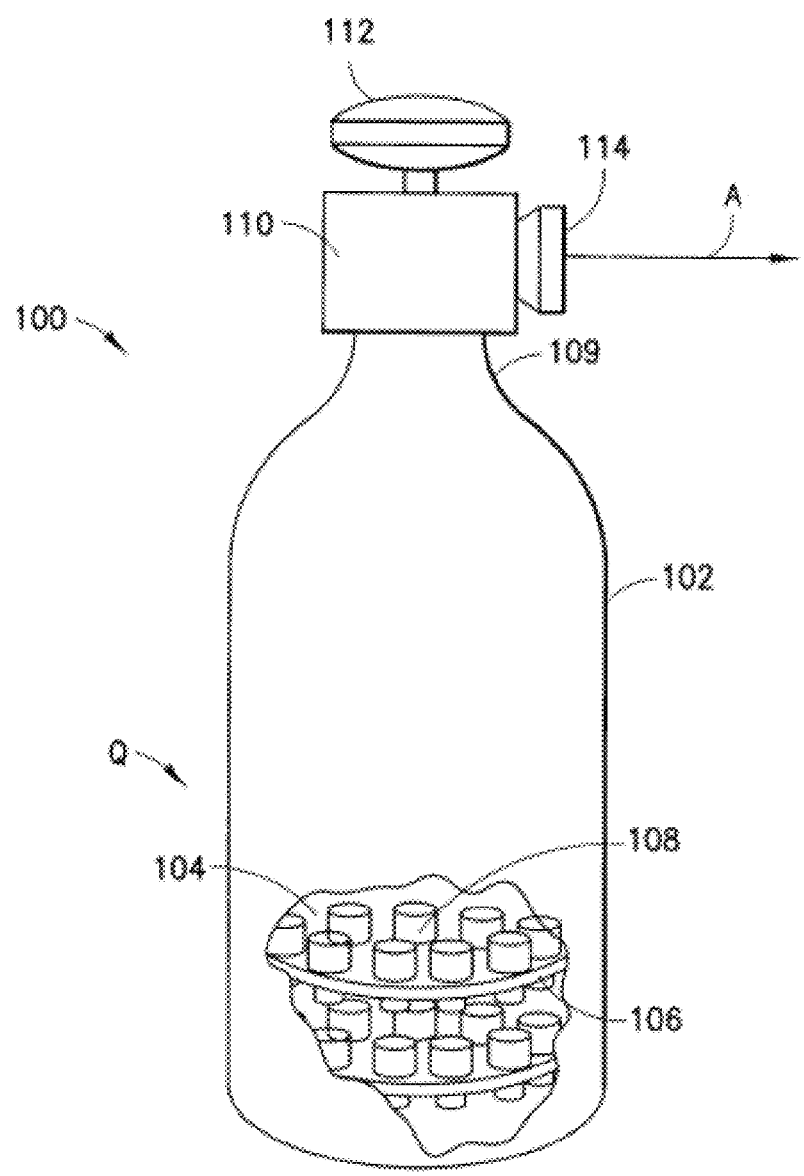
FIG. 2 is a schematic representation of a material storage and dispensing package containing a precursor of the present disclosure, in one embodiment thereof.

FIG. 2 is a schematic representation of a material storage and dispensing package 100 containing a cyclopentadienyl titanium alkoxide precursor, according to one embodiment of the present disclosure.

The material storage and dispensing package 100 includes a vessel 102 that may for example be of generally cylindrical shape as illustrated, defining an interior volume 104 therein. In this specific embodiment, the precursor is a solid at ambient temperature conditions, and such precursor may be supported on surfaces of the trays 106 disposed in the interior volume 104 of the vessel, with the trays having flow passage conduits 108 associated therewith, for flow of vapor upwardly in the vessel to the valve head assembly for dispensing, in use of the vessel.

The solid precursor can be coated on interior surfaces in the interior volume of the vessel, e.g., on the surfaces of the trays 106 and conduits 108. Such coating may be effected by introduction of the precursor into the vessel in a vapor form from which the solid precursor is condensed in a film on the surfaces in the vessel. Alternatively, the precursor solid may be dissolved or suspended in a solvent medium and deposited on surfaces in the interior volume of the vessel by solvent evaporation. In yet another method the precursor may be melted and poured onto the surfaces in the interior volume of the vessel. For such purpose, the vessel may contain substrate articles or elements that provide additional surface area in the vessel for support of the precursor film thereon.

As a still further alternative, the solid precursor may be provided in granular or finely divided form, which is poured into the vessel to be retained on the top supporting surfaces of the respective trays 106 therein. As another alternative, a metal foam body may be provided in the interior volume of the vessel, with such metal foam body comprising porosity of a specific character adapted for retaining the solid particulate precursor in order to achieve highly efficient vaporization thereof.

The vessel 102 has a neck portion 109 to which is joined the valve head assembly 110. The valve head assembly 110 is equipped with a hand wheel 112 in the embodiment shown. In lieu of a hand wheel, the valve head assembly may be coupled or otherwise operatively linked to a controller for automated operation. The valve head assembly 110 includes a dispensing port 114, which may be configured for coupling to a fitting or connection element to join flow circuitry to the vessel. Such flow circuitry is schematically represented by arrow A in FIG. 2, and the flow circuitry may be coupled to a downstream ALD or chemical vapor deposition chamber (not shown in FIG. 2).

In use, the vessel 102 can be heated with a suitable heater, such as a heating jacket, resistance heating elements affixed to the exterior wall surface of the vessel, or other suitable heating device(s) and arrangement, so that solid precursor in the vessel is at least partially volatilized to provide precursor vapor. The input of heat is schematically shown in FIG. 2 by the reference arrow Q. The precursor vapor is discharged from the vessel through the valve passages in the valve head assembly 110 when the hand wheel 112 or alternative valve actuator or controller is operated so that the valve element is translated to an open position, whereupon vapor deriving from the precursor is dispensed into the flow circuitry schematically indicated by arrow A.

Example 1

This example relates to titanium dioxide ($TiO_2$) atomic layer deposition (ALD), e.g., for use in semiconductor manufacturing operations.

ALD is used to deposit $TiO_2$ films in a very broad range of applications utilizing various substrates, a wide range of property requirements, and other process constraints. For example, $TiO_2$ is utilized in various DRAM capacitor applications, as a dopant of other oxides, as a bulk dielectric in a rutile structure, and as a main component in $SrTiO_3$ and related perovskites.

In carrying out deposition of titania films by ALD using titanium precursors, the process temperature may for example be in a range of from 200° C. to 300° C., and as oxygen sources, water or ozone may be employed.

A precursor screening effort was initiated, involving 130 precursor candidates from 22 chemical families, from which over 60 were obtained and screened, and 20 were ultimately tested in an ALD process system. In this screening effort, initial work involved testing volatility of precursor compounds using thermogravimetric analysis (TGA), and candidates exhibiting satisfactory volatility were then screened by measurement of the decomposition of the precursor after being subjected to 24 hours exposure to temperature higher than that required for delivery of the precursor in an ALD process. The criteria for passing both initial volatility and subsequent static thermal stability tests were selected based on compatibility with prevailing delivery systems used in commercial production ALD tools. Subsequent screening after volatility and static thermal stability testing included measurement of deposition rate and saturation.

Saturation of homoleptic amido titanium precursors was found to be improved by substitution with halide, "D5", and cyclopentadienyl ligands. In each instance, there is a trade-off in transport properties or deposition rate. The cyclopentadienyl substituted amide was found to have good saturation among the classes considered, with a deposition rate of 0.6 Å/cycle, but it was less saturated than the cyclopentadienyl substituted alkoxide.

Homoleptic alkoxides were found to achieve good deposition rates with both $H_2O$ and $O_3$, and to exhibit increasing deposition rate and improving saturation as the R-group decreases in length from the isopropoxide to the ethoxide to the methoxide, but with correspondingly increasing difficulty in delivery. In this respect, the isopropoxide is a high volatility, low viscosity liquid, the ethoxide has significant volatility and melting point below the delivery temperature, and the methoxide is a solid requiring appropriate solid delivery techniques.

Precursors that were evaluated in this screening effort included alkoxide precursors that were modified by substituting β-diketonate, halide, or cyclopentadienyl ligands, or in which R groups were modified to contain vinyl or acetylide bonding or trimethylsilyl groups. In general, modifying precursors by adding vinyl or acetylide bonding yielded volatile liquids with high deposition rate, at the expense of saturation behavior. The β-diketonate substituted compounds exhibited low deposition rates but were very stable in deposition. Improvements in volatility and deposition rate were achieved for low melting point solids, albeit with reduced saturation. Cyclopentadienyl substitution provided the best saturation in volatile liquids, but the deposition rates were modest (0.3 Å/cycle) in $O_3$ and unsuitable for use with $H_2O$. Addition of vinyl groups to the alkoxy ligands with cyclopentadienyl substitution provided volatile liquids with high deposition rates (0.8 Å/cycle) in $O_3$ and modest rates in $H_2O$, at a cost of approximately 25° C. in saturation ability.

Figure 3:
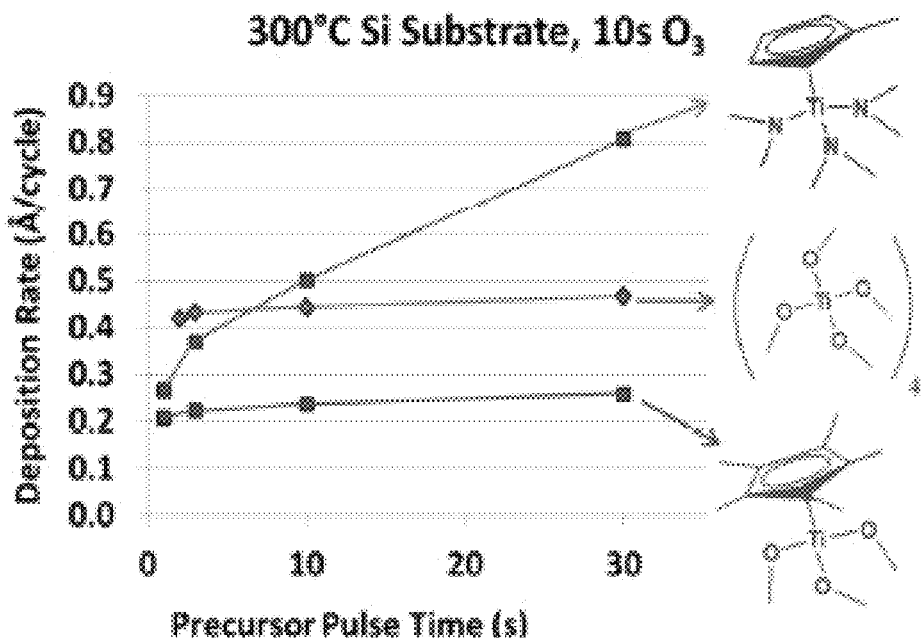
FIG. 3 is a plot of deposition rate (Angstroms/cycle) as a function of precursor pulse time(s), in an ALD process using the titanium precursors identified in such plot.

FIG. 3 is a plot of deposition rate (Angstroms/cycle) as a function of precursor pulse time(s), in an ALD process using the titanium precursors identified in such plot, deposited on a silicon substrate at temperature of 300° C. with 10 s $O_3$.

Figure 4:
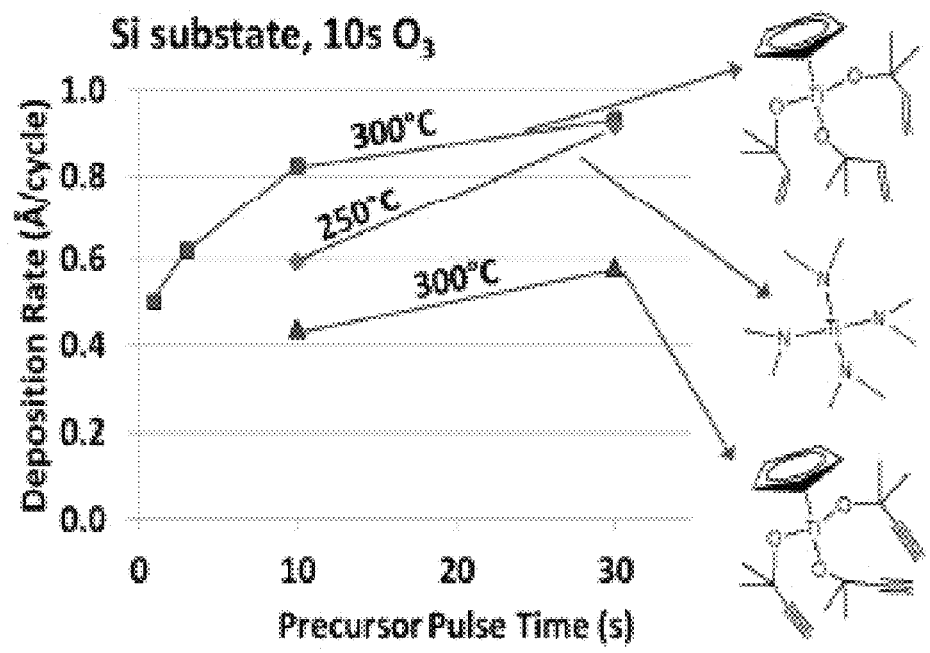
FIG. 4 is a plot of deposition rate (Angstroms/cycle) as a function of precursor pulse time(s), in an ALD process using the titanium precursors identified in such plot.

FIG. 4 is a plot of deposition rate (Angstroms/cycle) as a function of precursor pulse time(s), in an ALD process using the titanium precursors identified in such plot, deposited on a silicon substrate with 10 s $O_3$, at the temperatures specified in the graph.

Figure 5:
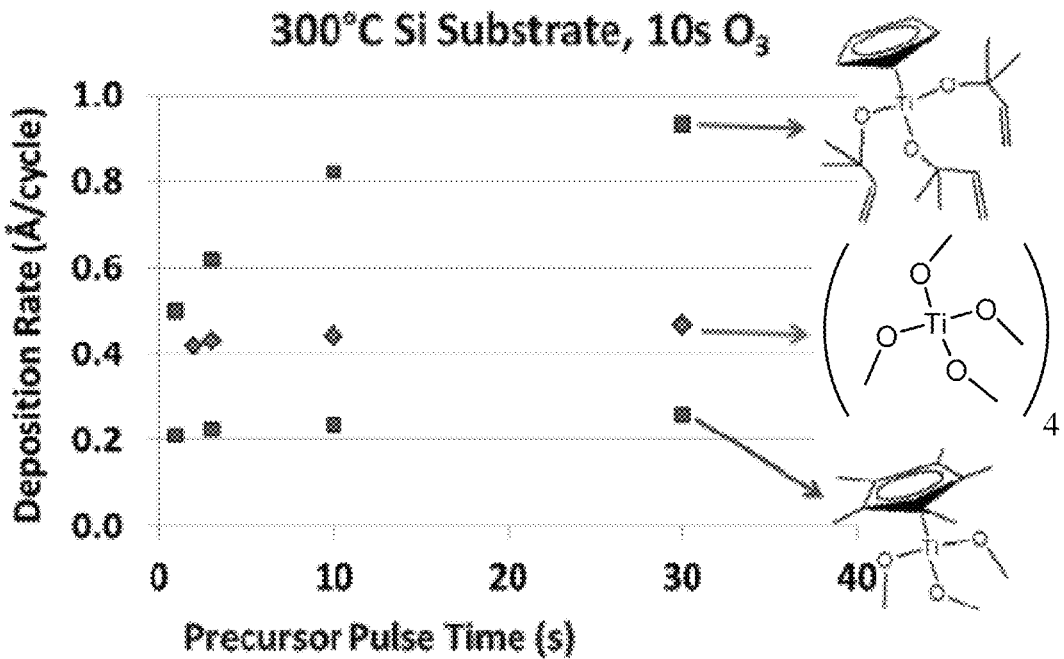
FIG. 5 is a plot of deposition rate (Angstroms/cycle) as a function of precursor pulse time(s), in an ALD process using the titanium precursors identified in such plot.

FIG. 5 is a plot of deposition rate (Angstroms/cycle) as a function of precursor pulse time(s), in an ALD process using the titanium precursors identified in such plot. Saturation of the deposition rate with increased precursor pulse demonstrated good ALD behavior of all three precursors. The top precursor is a volatile liquid with the highest rate. The middle precursor $Ti(OMe)_4)_4$ had a high rate, but was a solid at delivery temperature. The bottom precursor had excellent saturation in a volatile liquid, but exhibited a low rate.

Figure 6:
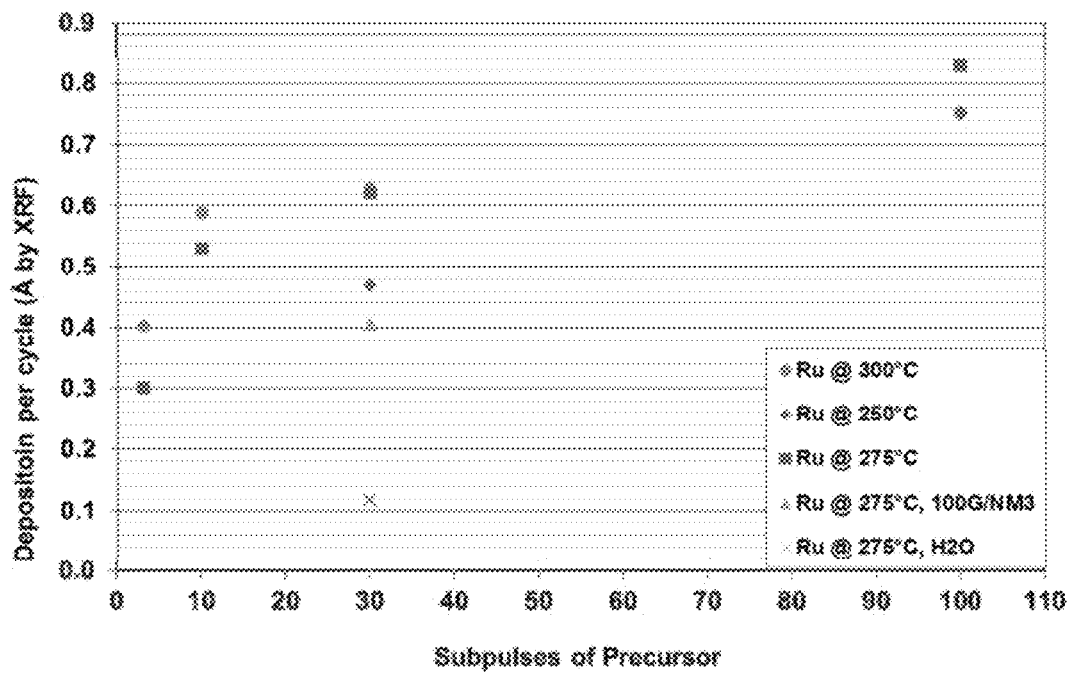
FIG. 6 is a plot of deposition per cycle (Angstroms, as measured by x-ray fluorescence (XRF)), as a function of subpulses of precursor, for deposition of Cp*triethanolaminetitanium on ruthenium substrates.

FIG. 6 is a plot of deposition per cycle (Angstroms, as measured by x-ray fluorescence (XRF)), as a function of subpulses of precursor, for deposition of Cp*triethanolaminetitanium

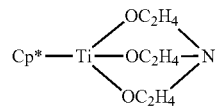

at 110° C. on ruthenium substrates at the temperatures specified, and with ozone (100 grams/normal meter cubed) and with $H_2O$. This precursor had good saturation at high rate.

As discussed hereinabove, cyclopentadienyltriethanolaminetitanium compounds of the present disclosure can be synthesized by reaction of the corresponding cyclopentadienyltitaniumtrichloride with triethylamine and nitrilotriethanol. For example, Cp*triethanolaminetitanium can be synthesized as described in the following Example 2.

Example 2

The following reaction was carried out to yield Cp*triethanolaminetitanium.

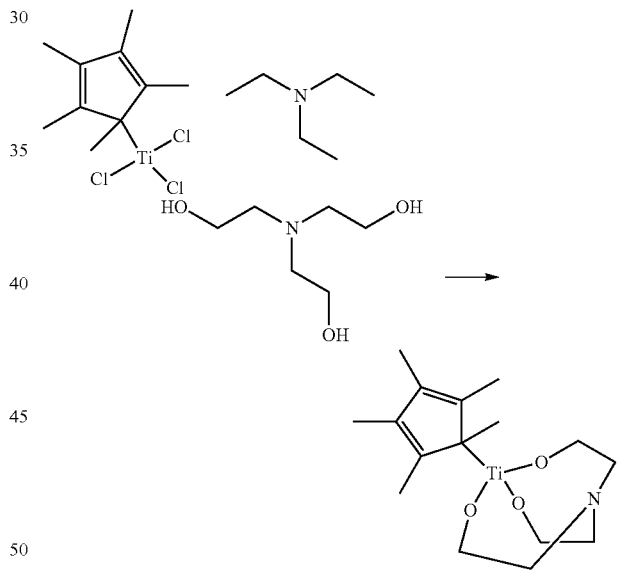

The reactants (1, 2, 3, 4, 5-tetramethylcyclopenta-2,4-dienyl)titanium(IV) chloride (5 g), triethylamine (5.51 g), and 2, 2', 2"-nitriltriethanol (8.12 g) were added to a 250 mL round bottom flask and filled with 150 mL of hexanes and approximately 10 mL of toluene. The mixture was not very soluble in this mixed solvent, however, the addition of 20 mL of methylene chloride aided solubility. The mixture first appeared light red/orange but turned light yellow after stirring. The reaction volume was maintained under stirring conditions for approximately 10 hours. A 6 mL aliquot of the mixture was filtered to recover a light yellow liquid. Solvent was removed under reduced pressure to yield light yellow crystals. NMR of the product in $CDCl_3$ indicated that the reaction was successful. The mixture was filtered using a medium porosity filter and rinsed with 50 mL of hexanes, yielding a light yellow solution. The solvent was removed under reduced pressure to obtain 3.92 g of the product. Elemental analysis of the product yielded % C=58.52, % H=8.04, % N=4.27, and % Cl=0.

Figure 7:
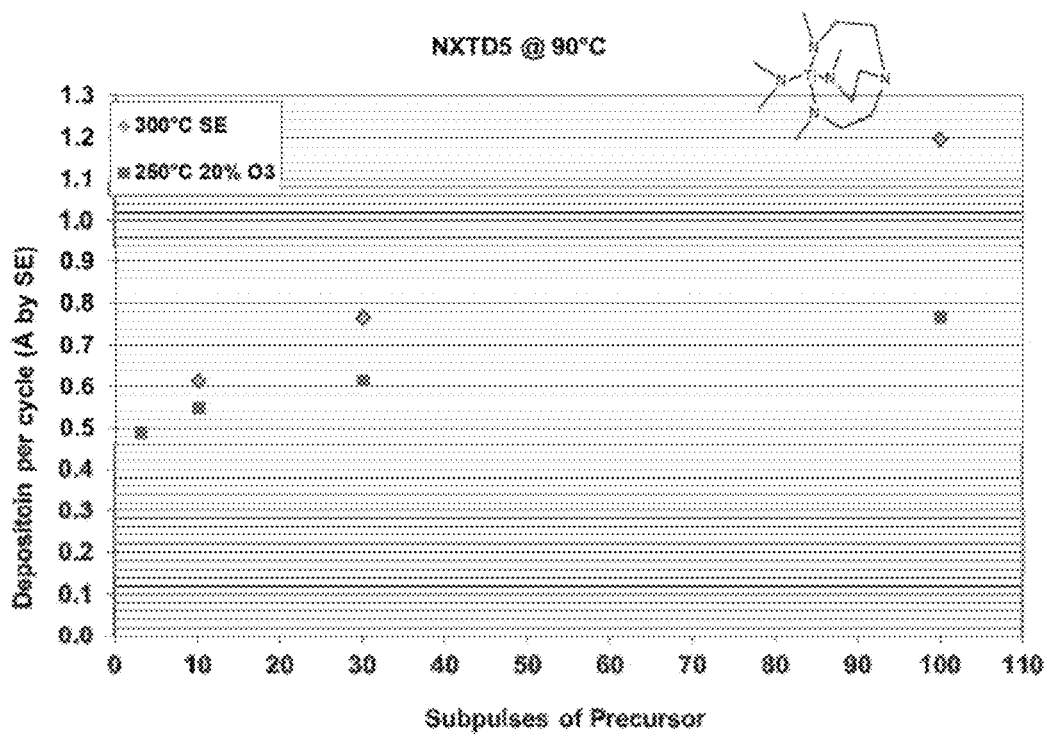
FIG. 7 is a plot of deposition per cycle (Angstroms as determined by SE) as a function of subpulses of precursor, for deposition of dimethylamino titianium tris(2-methylaminoethyl)amide.

FIG. 7 is a plot of deposition per cycle (Angstroms as determined by SE) as a function of subpulses of precursor, for deposition of dimethylamino titianium tris(2-methylaminoethyl)amide (denoted NXTD5) at 90° C. Saturation was reasonable at 250° C. but was not as good at 300° C.

Figure 8:
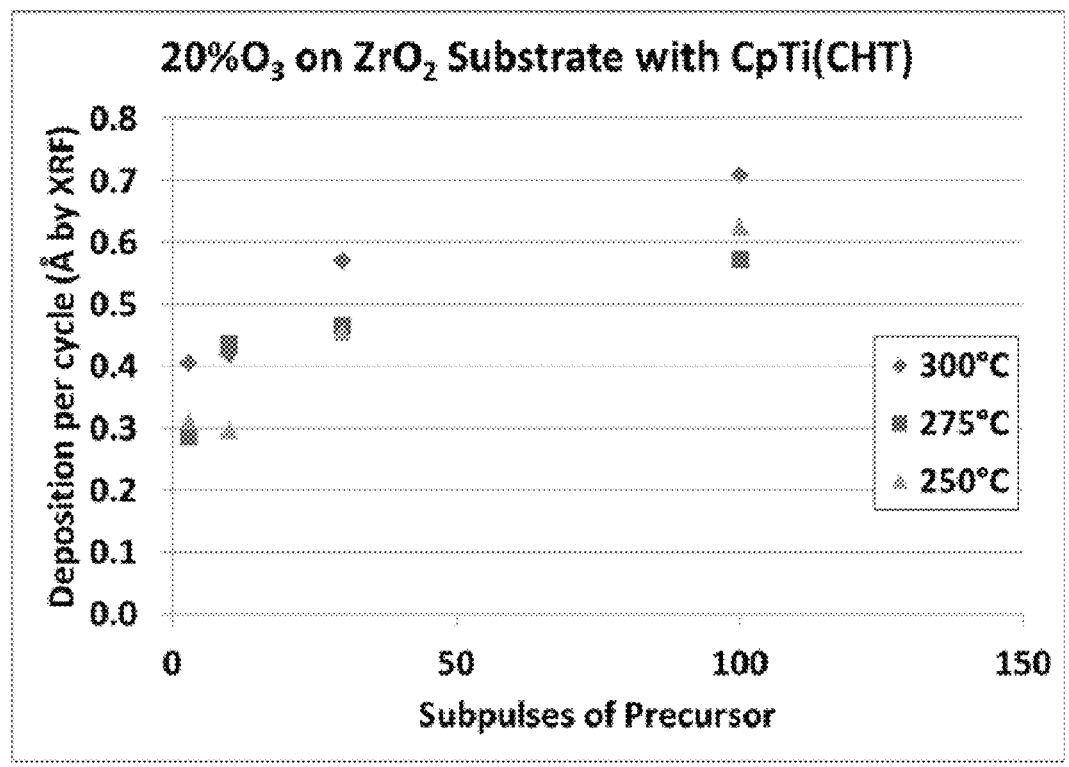
FIG. 8 is a plot of deposition per cycle (Angstroms as determined by x-ray fluorescence), as a function of subpulses of precursor, for deposition of titanium on a zirconia substrate from cyclopentadienyl(cycloheptatrienyl)titanium in a deposition ambient containing 20% ozone.

FIG. 8 is a plot of deposition per cycle (Angstroms as determined by x-ray fluorescence), as a function of subpulses of precursor, for deposition of titanium on a zirconia substrate from cyclopentadienyl(cycloheptatrienyl)titanium

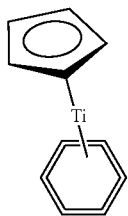

in a deposition ambient containing 20% ozone. Runs were carried out at 250° C., 275° C., and 300° C. As shown by the results in FIG. 8, good deposition performance was obtained at such temperatures, particularly at 100 subpulses of the precursor.

While the disclosure has been has been set forth herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the invention as hereinafter claimed is intended to be broadly construed and interpreted, as including all such variations, modifications and alternative embodiments, within its spirit and scope.

What is claimed is:

1. A method of forming a titanium-containing film on a substrate comprising conducting a vapor deposition process using an organotitanium compound comprising a compound of the formula

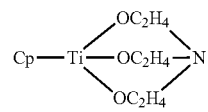

wherein Cp is

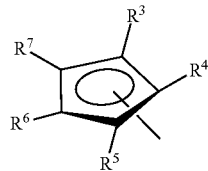

and each of $R^3$, $R^4$, $R^5$, $R^6$, and $R^7$ is the same as or different from the others, and each is independently selected from H and $C_1$-$C_{12}$ alkyl.

* * * * *